(12) United States Patent
Kumar et al.

(10) Patent No.: US 6,611,161 B1
(45) Date of Patent: Aug. 26, 2003

(54) CHARGE PUMP CIRCUIT FOR A HIGH SPEED PHASE LOCKED LOOP

(75) Inventors: Ravi Kumar, Bangalore (IN); Chandra P. Tiwari, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/993,283

(22) Filed: Nov. 6, 2001

(51) Int. Cl.[7] .................................................. H03L 7/06
(52) U.S. Cl. ........................................ 327/157; 327/148
(58) Field of Search ............................... 327/156, 157, 327/158, 148; 331/11, 17, 25; 375/375, 376

(56) References Cited

U.S. PATENT DOCUMENTS

| | | | | |
|---|---|---|---|---|
| 5,412,349 A | * | 5/1995 | Young et al. ................ 331/1 A |
| 5,740,213 A | * | 4/1998 | Dreyer ........................ 327/157 |
| 6,011,822 A | * | 1/2000 | Dreyer ........................ 327/156 |
| 6,172,571 B1 | * | 1/2001 | Moyal et al. .................. 331/11 |
| 6,265,946 B1 | * | 7/2001 | Bartlett ....................... 327/111 |
| 2001/0015677 A1 | * | 8/2001 | Choi ............................. 331/11 |

* cited by examiner

*Primary Examiner*—Timothy P. Callahan
*Assistant Examiner*—Linh Nguyen

(57) ABSTRACT

A charge sharing suppression circuit for a charge pump circuit in a phase locked loop is disclosed that is capable of suppressing charge sharing due to static phase error in the phase locked loop. A return path is provided to allow charge pump currents to flow when static phase error exists. A first switch in the return path closes in response to an UP signal from a phase frequency detector and a second switch closes in response to an inverted version of a DN signal. A third switch in the return path closes in response to an inverted version of an UP signal and a fourth switch closes in response to a DN signal. The return path is disabled in the absence of static phase error.

24 Claims, 5 Drawing Sheets

CHARGE PUMP CIRCUIT FOR A HIGH SPEED PHASE LOCKED LOOP

CROSS-REFERENCE TO RELATED APPLICATIONS

The present invention is related to those disclosed in the following United States Non-Provisional Patent Applications:

1) [Docket No. NATI15-04950], filed concurrently herewith, entitled "PHASE-LOCKED LOOP FREQUENCY SYNTHESIZER USING AUTOMATIC LOOP CONTROL AND METHOD OF OPERATION"; and 2) [Docket No. NATI15-04953] filed concurrently herewith, entitled "LOCK DETECTION CIRCUIT FOR A PHASE LOCKED LOOP CIRCUIT".

The above patent applications are commonly assigned to the assignee of the present invention. The disclosures of these related patent applications are hereby incorporated by reference for all purposes as if fully set forth herein.

FIELD OF THE INVENTION

The present invention relates generally to the field of integrated circuit technology. The present invention provides an improved charge pump circuit that suppresses charge sharing due to static phase error in a high speed phase locked loop circuit.

BACKGROUND OF THE INVENTION

Phase locked loop circuits are well known. FIG. 1 illustrates a block diagram of a prior art frequency synthesizer charge pump phase locked loop (PLL) circuit 100. Input signal FIN is provided to input divider 110 and an external clock signal RFC from input provider 110 is provided to a first input of phase frequency detector 120. Phase frequency detector 120 provides an "up" signal (designated "UP") and a "down" signal (designated "DN") to charge pump 130. As is well known in the art, the UP signal closes a switch to cause current source 140 to provide current $I_{UP}$ to the output line of charge pump 130. The DN signal closes a switch to cause current source 150 to draw current $I_{DN}$ from the output line of charge pump 130.

The output line of charge pump 130 is coupled to loop filter 160 and to voltage controlled oscillator (VCO) 170. The currents from charge pump 130 adjust the phase of the voltage controlled oscillator 170. The output signal $F_{OUT}$ from voltage controlled oscillator 170 is provided to feedback divider 180. An internal clock feedback signal FBC from feedback divider 180 is provided to a second input of phase frequency detector 120. Phase frequency detector 120 compares the FBC signal from feedback divider 180 with the RFC signal from input divider 110.

A charge pump PLL is a negative feedback system that insures that the phase difference as well as the frequency difference at the input of phase frequency detector 120 is near zero under steady state conditions. A PLL in such a state is said to be in a "lock" condition or "locked." The input and output frequencies are related by a fixed ratio which can be selected by choosing the values of the input divider 110 and the feedback frequency divider 180.

A charge pump PLL is typically a second order system. Therefore, any change from the steady state condition will result in a transient response that is typically characterized by the damping factor and the natural frequency of the system. The damping factor and the natural frequency of the system are dependent upon physical quantities such as the charge pump current, the effective gain of the voltage controlled oscillator 170, the parameters of loop filter 160, and properties of the phase frequency detector 120. The settling behavior of the transient response may also be governed by the comparison frequency at the input of the phase frequency detector 120.

The output of phase frequency detector 120 comprises pulses at the UP output pin and at the DN output pin such that the difference in the pulse widths of the UP signal and the DN signal is equal to the input phase difference. The UP and DN signals are provided to charge pump 130. In response, charge pump 130 dumps an equivalent charge to adjust the phase of the voltage controlled oscillator 170. In a locked state, the output of phase frequency detector 120 comprises narrow pulses of equal duration on the UP output pin and on the DN output pin. The use of narrow pulses even in the locked state prevents the formation of a dead zone for small phase differences at the input of phase frequency detector 120.

There are deviations from ideal behavior in a practical system. For example, the "up" current $I_{UP}$ and the "down" current $I_{DN}$ in charge pump 130 are not exactly equal due to the finite output impedance of current source 140 and current source 150. There can also be delay mismatches between the UP signal and the DN signal at the output of phase frequency detector 120. Leakage in loop filter 160 may also affect the operation of the charge pump PLL system.

Because the charge pump PLL system is a negative feedback system, the PLL corrects for all the non-ideal conditions by having a small phase offset at the input of the phase frequency detector 120 of an appropriate magnitude and polarity to negate these effects. This phase difference at the input of the phase frequency detector 120 is called the "static phase error."

FIG. 2 illustrates a circuit diagram of a charge pump circuit 130 comprising a prior art charge sharing suppression circuit 200 capable of suppressing charge sharing due to parasitic capacitances within charge pump circuit 130.

Switch S1 in charge pump circuit 130 closes when switch S1 receives an up signal. Switch S2 in charge pump circuit 130 closes when switch S2 receives a DN signal. Output line 210 of charge pump circuit 130 outputs a control voltage $V_{CONTROL}$ to loop filter 160 and to voltage controlled oscillator 170.

Charge sharing suppression circuit 200 comprises signal line 220 and signal line 230. A first end of signal line 220 is coupled to the output of current source 140 at node N1. A first end of signal line 230 is coupled to the input of current source 150 at node N2. A second end of signal line 220 and a second end of signal line 230 are coupled together at node N3.

A first input of amplifier 240 is coupled to output line 210. The output of amplifier 240 is coupled to node N3. The output of amplifier 240 is also coupled to a second input of amplifier 240 to place amplifier 240 in a unity gain configuration.

Switch S3 is located within signal line 220. Switch S3 closes when switch S3 receives an inverted UP signal (denoted as UPB). Switch S4 is located within signal line 230. Switch S4 closes when switch S4 receives an inverted DN signal (denoted as DNB).

The current $I_{UP}$ from current source 140 and the current $I_{DN}$ from current source 150 need to be equal. Therefore, when node N1 and node N2 are not switched to $V_{CONTROL}$ (i.e., when switch S1 and switch S2 are open) then node N1 and node N2 are biased by unity gain amplifier 240 because switch S3 and switch S4 are closed. This suppresses the charge sharing from parasitic capacitance on node N1 or node N2 that can cause mismatch between current source 140 and current source 150.

Prior art charge sharing suppression circuit 200 operates correctly when the PLL is locked and there is no static phase error. However, if there is any static phase error due to the difference in arrival times of the UP signal and the DN signal there will be no return path for the charge pump currents during the duration of the static phase error.

For example, consider the UP signal and the DN signal shown in FIG. 3. The DN signal arrives before the UP signal arrives. During the time of the static phase error there is a mismatch in the signals in that the DN signal is present but the UP signal is not. There is no return path for the current $I_{UP}$ because switch S3 is closed (by the signal UPB) while switch S4 is still open (by the absence of the signal DNB). This condition will cause node N1 to charge up to the voltage $V_{dd}$. The extra charge is redistributed on the loop filter 160 during the next comparison cycle. This leads to low frequency jitter.

A similar situation occurs when an UP signal arrives before a DN signal. During the time of the static phase error there is a mismatch in the signals in that the UP signal is present but the DN signal is not. There is no return path for the current $I_{DN}$ because switch S4 is closed (by the signal DNB) while switch S3 is still open (by the absence of the signal UPB). This condition will cause node N2 to charge down to the voltage $V_{ss}$. The extra charge is redistributed on the loop filter 160 during the next comparison cycle. This also leads to low frequency jitter.

It would be desirable to have a charge pump circuit in a phase locked loop circuit that is capable of suppressing charge sharing due to static phase error within the charge pump circuit.

It would also be desirable to have a charge pump circuit in a phase locked loop circuit that is capable of reducing low frequency jitter at the output of the phase locked loop circuit.

It would also be desirable to have a charge pump circuit in a phase locked loop circuit that is capable of providing a return path for charge pump currents to flow during the time that static phase error exists within the charge pump circuit.

SUMMARY OF THE INVENTION

The present invention is directed to an apparatus and method for providing a charge pump circuit in a phase locked loop circuit that is capable of suppressing charge sharing due to static phase error in a high speed phase locked loop circuit.

An advantageous embodiment of the present invention is adapted for use within a charge pump circuit of the type comprising a charge sharing suppression circuit for suppressing charge sharing due to parasitic capacitances within the charge pump circuit. The charge suppression circuit of the present invention for suppressing charge sharing due to static phase error within the charge pump generally comprises a first signal line, a second signal line and a return path signal line. The first signal line is coupled to the output of an $I_{UP}$ current source and to the return signal path line. The first signal line comprises a first switch that closes in response to an UP signal and a second switch that closes in response to a DNB signal. The second signal line is coupled to the return signal path line and to the input of an $I_{DN}$ current source. The second signal line comprises a third switch that closes in response to an UPB signal and a fourth switch that closes in response to a DN signal.

The return path signal line is coupled to an output of a unity gain amplifier in the charge sharing suppression circuit for suppressing charge sharing due to parasitic capacitances within the charge pump circuit. The combination of the first and second switches in the first signal line and the third and fourth switches in the second signal line and the return path signal line provide a return path for currents that would otherwise not be able to flow during the time that the static phase error exists due to the mismatch of an UP signal and a DN signal.

It is an object of the present invention to provide an apparatus and method for providing a charge pump circuit for a phase locked loop circuit that is capable of suppressing charge sharing due to static phase error within the charge pump circuit.

It is another object of the present invention to provide an apparatus and method for providing a charge pump circuit for a phase locked loop circuit that is capable of reducing low frequency jitter at the output of the phase locked loop circuit.

It is also an object of the present invention to provide an apparatus and method for providing a charge pump circuit for a phase locked loop circuit that is capable of providing a return path for charge pump currents to flow during the time that static phase error exists within the charge pump circuit.

It is another object of the present invention to provide an apparatus and method for providing a charge pump circuit for a phase locked loop circuit that is capable of suppressing charge sharing due to static phase error within the charge pump circuit when a DN signal arrives at the charge pump circuit before an UP signal.

It is another object of the present invention to provide an apparatus and method for providing a charge pump circuit for a phase locked loop circuit that is capable of suppressing charge sharing due to static phase error within the charge pump circuit when an UP signal arrives at the charge pump circuit before a DN signal.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase locked loop system.

Figure 1:
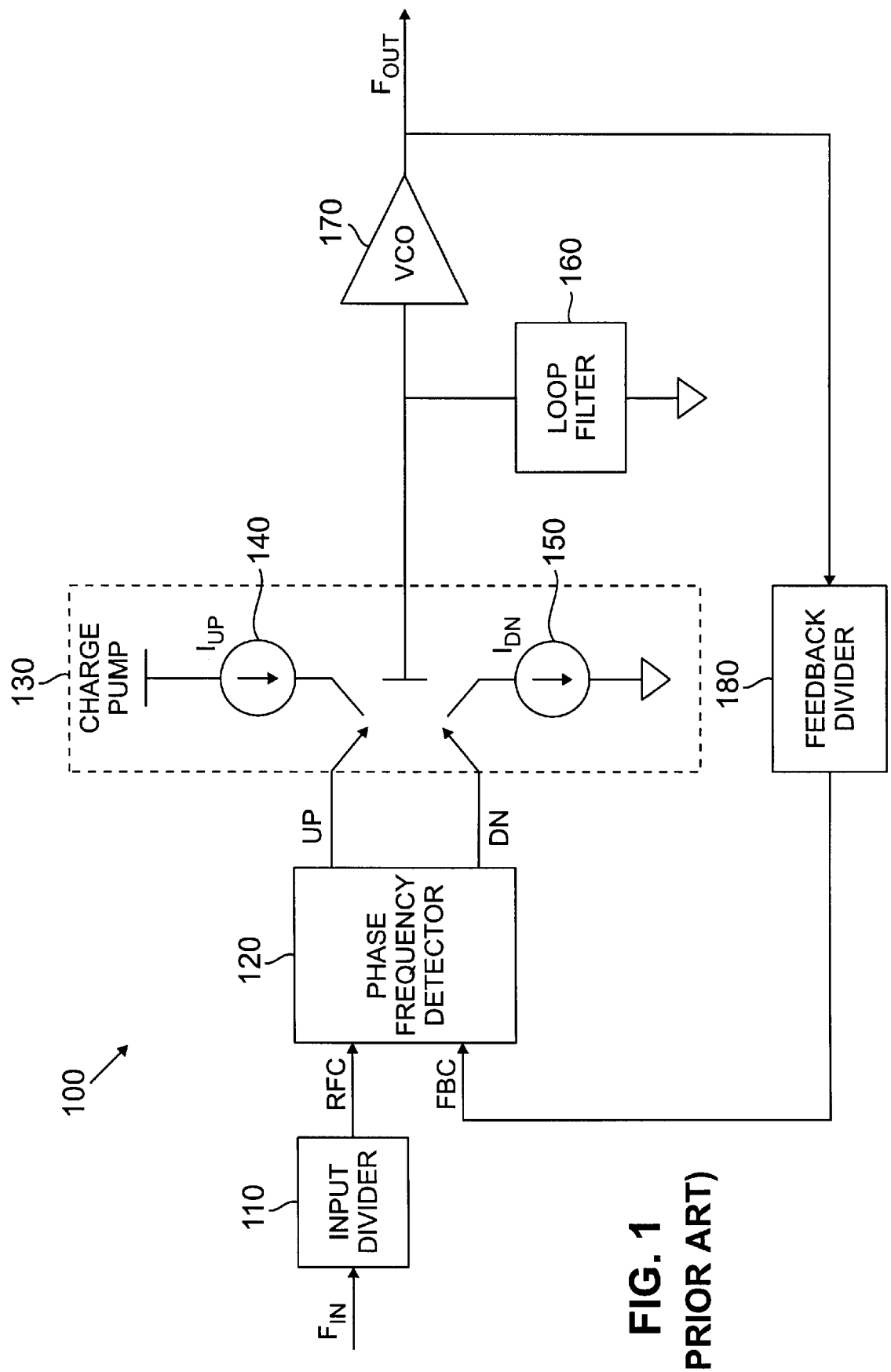
FIG. 1 illustrates a block diagram of a prior art frequency synthesizer charge pump phase locked loop (PLL) circuit.
Figure 2:
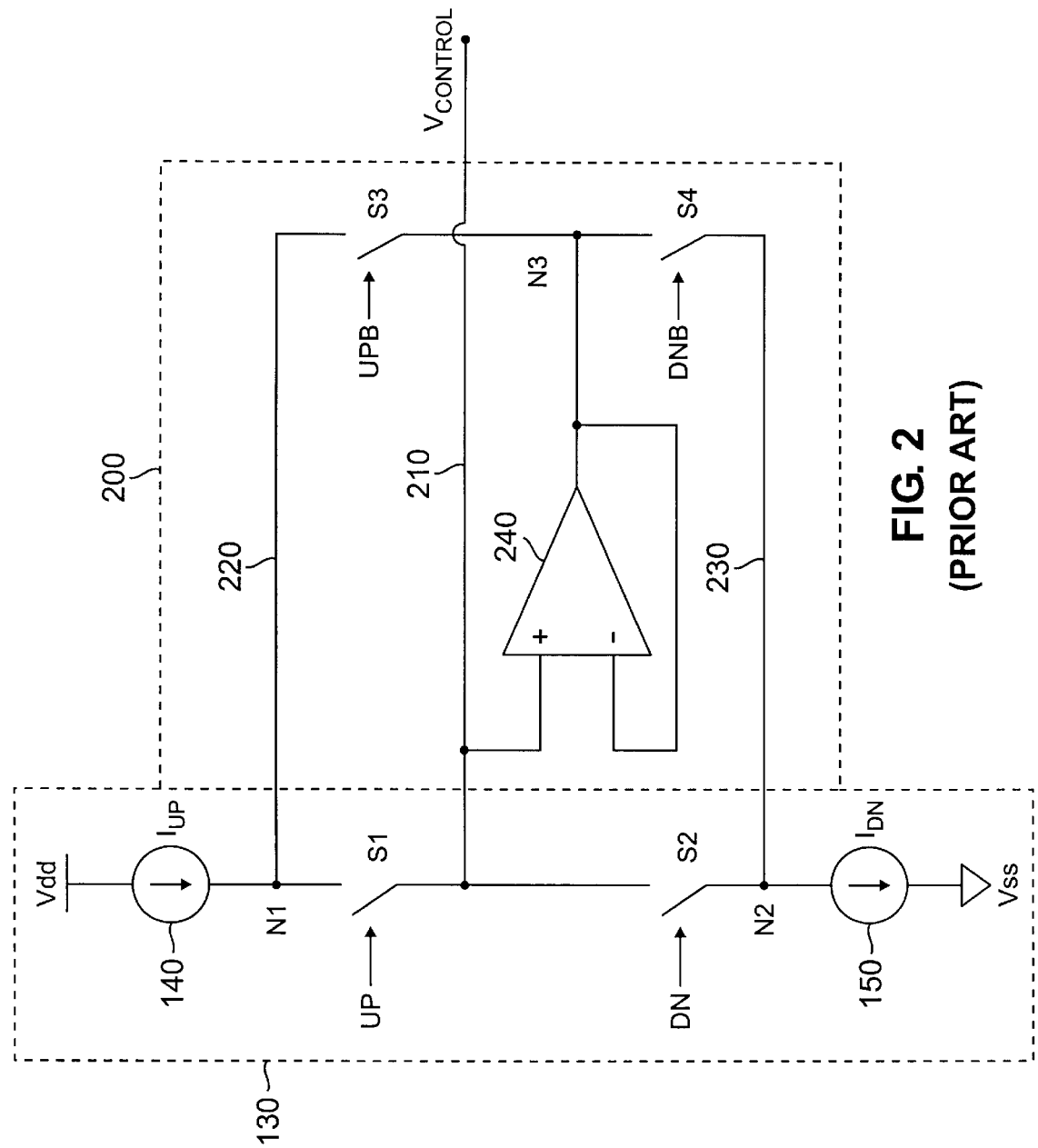
FIG. 2 illustrates a circuit diagram of a prior art charge pump circuit and a prior art charge sharing suppression circuit for suppressing charge sharing due to parasitic capacitances within the charge pump circuit.

As previously described, FIG. 1 illustrates a block diagram of a prior art frequency synthesizer charge pump phase locked loop (PLL) circuit 100. FIG. 2 illustrates a circuit diagram of a prior art charge pump 130 and a prior art charge sharing suppression circuit 200 for suppressing charge sharing due to parasitic capacitances within charge pump circuit 130.

Figure 4:
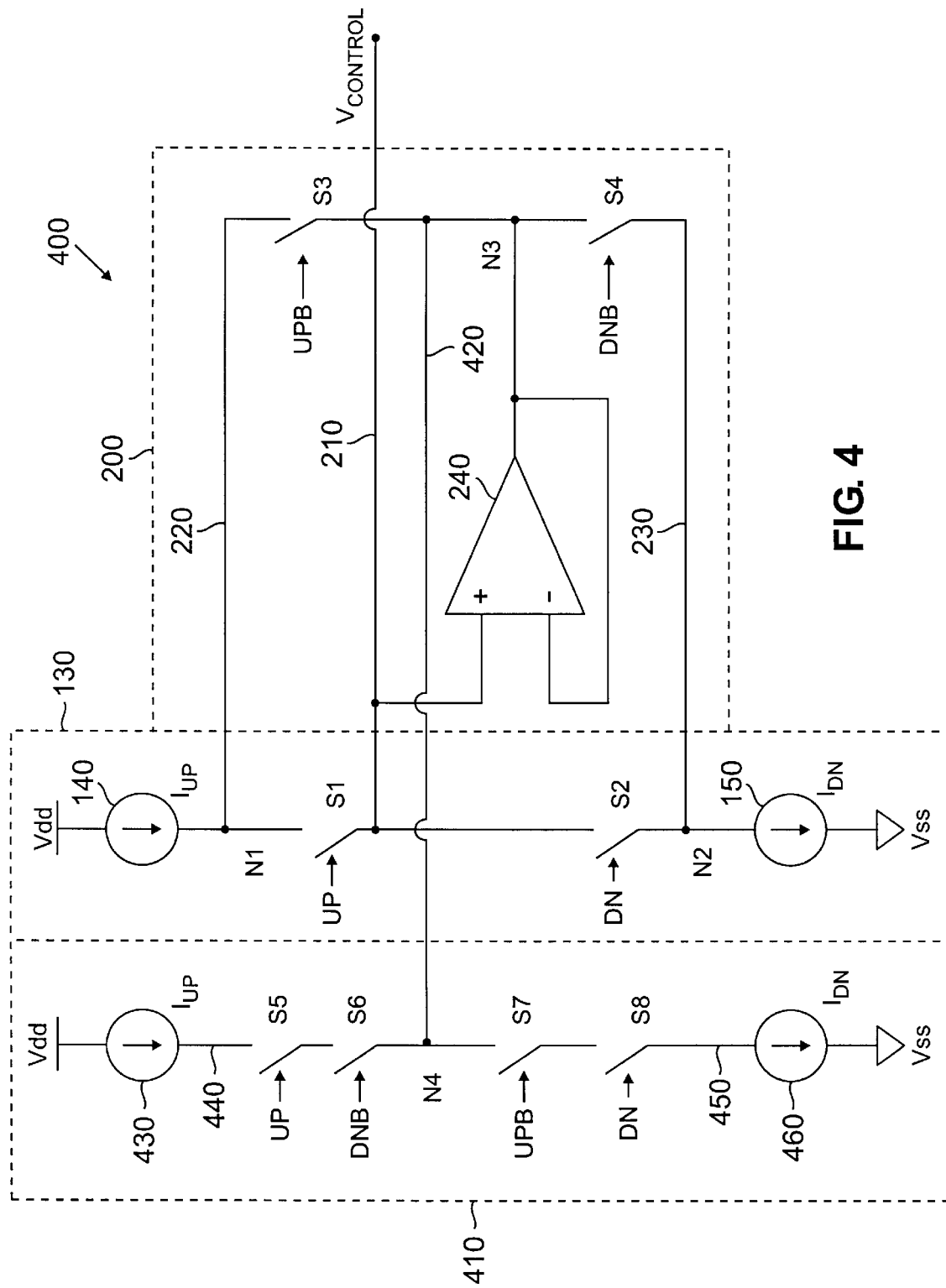
FIG. 4 illustrates a circuit diagram of a charge pump circuit that is capable of suppressing charge sharing due to static phase error in accordance with the principles of the present invention.

FIG. 4 illustrates a circuit diagram of an advantageous embodiment of the charge pump circuit 400 of the present invention. Charge pump circuit 400 comprises charge pump 130, charge sharing suppression circuit 200, charge sharing suppression circuit 410 and return path signal line 420. As will be more fully described, charge sharing suppression circuit 410 suppresses charge sharing due to static phase error.

Charge sharing suppression circuit 410 comprises signal line 440 and signal line 450. A first end of signal line 440 is coupled to the output of current source 430. Current source 430 and current source 140 have the same current $I_{UP}$.

A first end of signal line 450 is coupled to the input of current source 460. Current source 460 and current source 150 have the same current $I_{DN}$.

A second end of signal line 440 and a second end of signal line 450 are coupled together at node N4. A first end of return path signal line 420 is coupled to node N4 and a second end of return path signal line 420 is coupled to node N3. Node N3 and node N4 are therefore equivalent nodes.

Switch S5 and switch S6 are located within signal line 440. Switch S5 closes when switch S5 receives an UP Signal. Switch S6 closes when switch S6 receives an inverted DN signal (denoted as DNB).

Switch S7 and switch S8 are located within signal line 450. Switch S7 closes when switch S7 receives an inverted UP signal (denoted as UPB). Switch S8 closes when switch S8 receives a DN signal.

Switch S5, switch S6, switch S7, switch S8, and return path signal line 420 operate to provide a return path for the charge pump currents during the duration of static phase error. Depending upon the nature of the static phase error (whether the UP signal arrives first or whether the DN signal arrives first), the switches S5, S6, S7, and S8 within charge sharing suppression circuit 410 will operate to source or sink the charge pump currents during the time that the static phase error exists. In this manner charge sharing suppression circuit 410 suppresses the charge that would otherwise build up due to the static phase error. The suppression of the charge provides better noise performance in the phase locked loop circuit.

Figure 3:
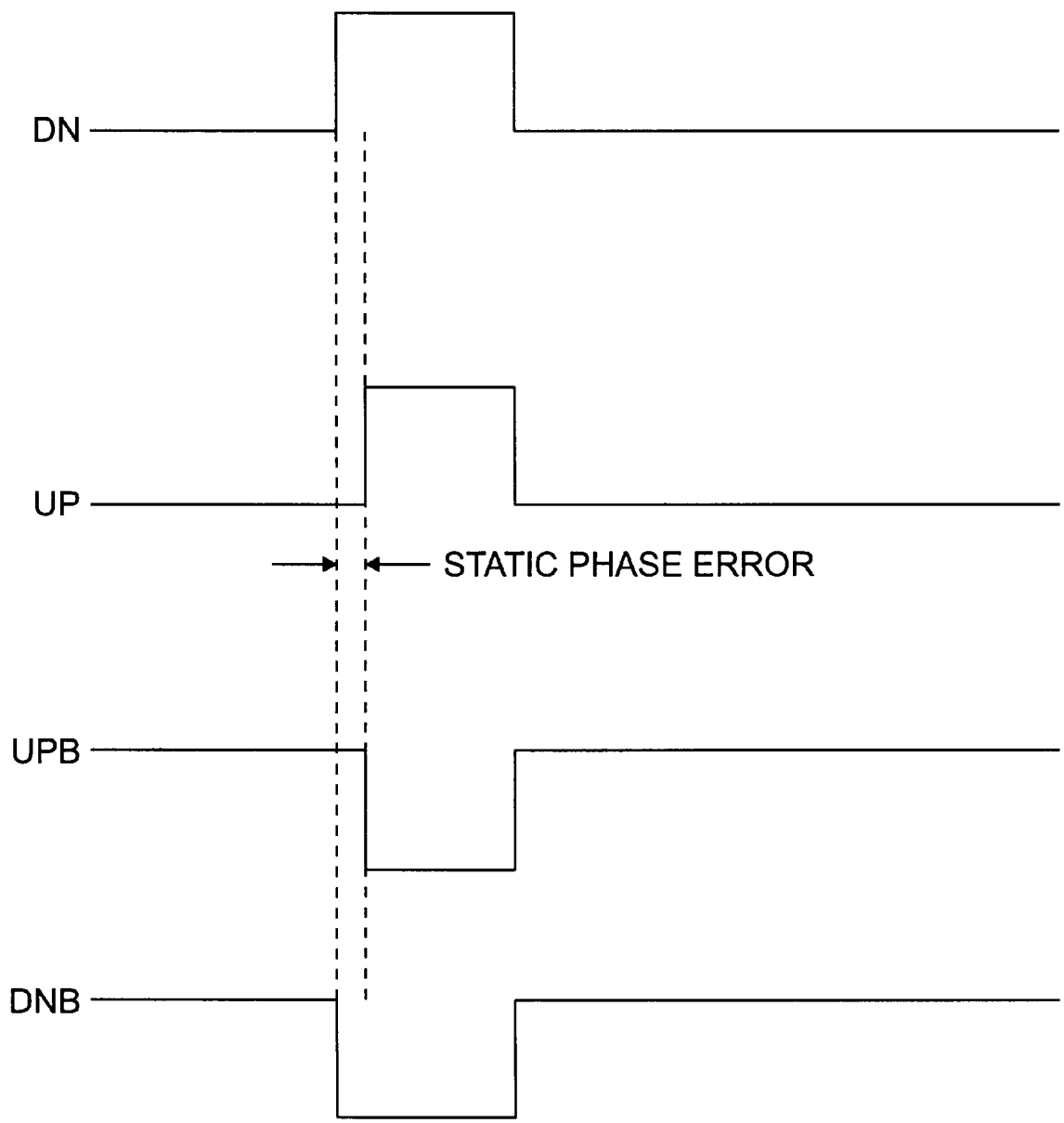
FIG. 3 illustrates a DN signal pulse that occurs slightly before an UP signal pulse creating a static phase error time duration between the leading edge of the DN signal pulse and the leading edge of the UP signal pulse.

For example, consider the UP signal and the DN signal shown in FIG. 3. The DN signal arrives before the UP signal arrives. During the time of the static phase error there is a mismatch in the signals in that the DN signal is present but the UP signal is not. In charge pump circuit 400 of the present invention there is a return path through return path signal line 420 for the current $I_{UP}$ during the time of the static phase error. Switch S3 is closed (by the signal UPB) and switch S4 is still open (by the absence of the signal DNB). However, in signal line 450 switch S7 is closed (by the signal UPB) and switch S8 is closed (by the DN signal). The presence of switch S7 in signal line 450 ensures that current flows in signal line 450 only when the UP signal and the DN signal are mismatched. When the UP signal arrives switch S7 will open due to the absence of the UPB signal. Switch S7 and switch S8 in signal line 450 allow the current $I_{UP}$ to flow from node N3 through return path signal line 420 and through signal line 450 to current source 460. This prevents node N1 from charging up to the voltage $V_{dd}$ and prevents low frequency jitter that would otherwise occur.

A similar situation occurs when an UP signal arrives before a DN signal. During the time of the static phase error there is a mismatch in the signals in that the UP signal is present but the DN signal is not. In charge pump circuit 400 of the present invention there is a return path through return path signal line 420 for the current $I_{DN}$ during the time of the static phase error. Switch S4 is closed (by the signal DNB) and switch S3 is still open (by the absence of the signal UPB). However, in signal line 440 switch S5 is closed (by the UP signal) and switch S6 is closed (by the DNB signal). The presence of switch S6 in signal line 440 ensures that current flows in signal line 440 only when the UP signal and the DN signal are mismatched. When the DN signal arrives switch S6 will open due to the absence of the DNB signal. Switch S5 and switch S6 in signal line 440 allow the current $I_{DN}$ to flow from current source 430 through signal line 440 to node N4 and through return path signal line 420 to node N3 and through signal line 230 to node N2 to current source 150. This prevents node N2 from charging down to the voltage $V_{ss}$ and prevents low frequency jitter that would otherwise occur.

Figure 5:
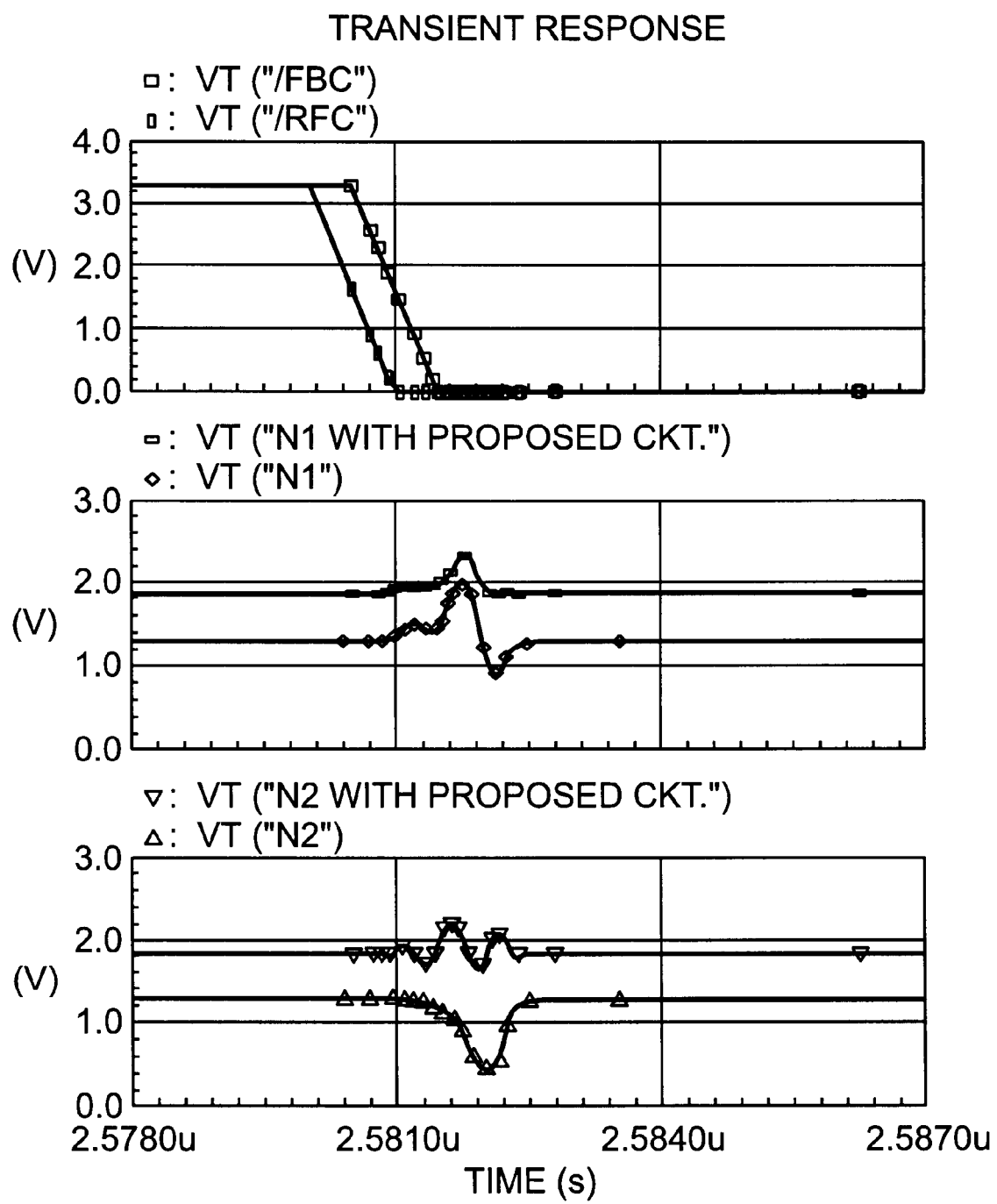
FIG. 5 illustrates a graph of a transient response voltage versus time and corresponding graphs of a first charge pump node voltage versus time and a second charge pump node voltage versus time for both a prior art charge pump circuit and for a charge pump circuit of the present invention.

FIG. 5 illustrates a graph of a transient response voltage versus time and corresponding graphs of a first charge pump node voltage versus time and a second charge pump node voltage versus time for both a prior art charge pump circuit and for a charge pump circuit of the present invention. The time scale in seconds for all three graphs is located beneath the bottom graph.

The top graph represents a transient response voltage for the external clock signal RFC (designated "RFC") from input divider 110 and a transient response for the internal clock feedback signal FBC (designated "FBC") from feedback divider 180. In this example the value of the voltage of the RFC signal drops before the value of the voltage of the FBC signal starts to drop. This causes a DN signal to arrive before an UP signal arrives.

A corresponding graph of voltage versus time for the charge-pump node N1 is shown in the middle graph. The graph for the values designed "N1" (the prior art charge pump circuit) shows a higher voltage swing than the graph for the values designated "N1 with Proposed Ckt" (the charge pump circuit of the present invention). The higher voltage swing at node N1 in the prior art charge pump circuit is due to the charge build up during the time of the static phase error. The distribution of the extra charge from node N1 on loop filter 160 during the next comparison cycle increases the low frequency jitter of the phase locked loop circuit.

A corresponding graph of voltage versus time for the charge pump node N2 is shown in the bottom graph. The graph for the values designed "N2" (the prior art charge pump circuit) shows a higher voltage swing than the graph for the values designated "N2 with Proposed Ckt" (the charge pump circuit of the present invention). The higher voltage swing in the prior art charge pump circuit is due to the charge build up during the time of the static phase error. The distribution of the extra charge from node N2 on loop filter 160 during the next comparison cycle increases the low frequency jitter of the phase locked loop circuit.

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A charge pump circuit for a phase locked loop circuit, said charge pump circuit comprising:
   a charge sharing suppression circuit for suppressing charge sharing due to static phase error in said phase locked loop circuit wherein said charge sharing suppression circuit comprises a return path for a charge pump current to flow during a period of time in which static phase error exisits within said charge pump circuit.

2. A charge pump circuit as claimed in claim 1 wherein said charge sharing suppression circuit comprises a return path for a charge pump current to flow during a period of time in which static phase error exists within said charge pump circuit after a DN signal from a phase frequency detector arrives at said charge pump circuit and before an UP signal from said phase frequency detector arrives at said charge pump circuit.

3. A charge pump circuit as claimed in claim 1 wherein said charge sharing suppression circuit comprises a return path for a charge pump current to flow during a period of time in which static phase error exists within said charge pump circuit after an UP signal from a phase frequency detector arrives at said charge pump circuit and before a DN signal from said phase frequency detector arrives at said charge pump circuit.

4. A charge pump circuit as claimed in claim 3 wherein said return path of said charge sharing suppression circuit comprises:
   a current source;
   a signal line having a first end coupled to an output of said current source;
   a first switch within said signal line that closes in response to the presence of said UP signal;
   a second switch within said signal line that closes in response to the presence of an inverted version of said DN signal; and
   a return path signal line coupled to a second end of said signal line.

5. A charge pump circuit as claimed in claim 2 wherein said return path of said charge sharing suppression circuit comprises:
   a current source;
   a signal line having a first end coupled to an input of said current source;
   a first switch within said signal line that closes in response to the presence of an inverted version of said UP signal; and
   a second switch within said signal line that closes in response to the presence of said DN signal; and
   a return path signal line coupled to a second end of said signal line.

6. A charge pump circuit as claimed in claim 1 wherein said return path of said charge sharing suppression circuit comprises:
   a first current source;
   a second current source;
   a first signal line having a first end coupled to an output of said first current source;
   a first switch within said first signal line that closes in response to the presence of an UP signal from a phase frequency detector;
   a second switch within said first signal line that closes in response to the presence of an inverted version of a DN signal from said phase frequency detector;
   a second signal line having a first end coupled to an input of said second current source and having a second end coupled to a second end of said first signal line;
   a third switch within said second signal line that closes in response to the presence of an inverted version of said UP signal;
   a fourth switch within said second signal line that closes in response to the presence of said DN signal; and
   a return path signal line coupled to said second end of said first signal line and coupled to said second end of said second signal line.

7. A charge pump circuit as claimed in claim 1 wherein said return path of said charge sharing suppression circuit is coupled to a parasitic capacitance charge sharing suppression circuit that is capable of suppressing charge sharing due to parasitic capacitances within said charge pump circuit.

8. A charge pump circuit as claimed in claim 7 wherein said return path of said charge sharing suppression circuit permits a charge pump current to flow through said parasitic capacitance charge sharing suppression circuit during a period of time in which static phase error exists within said charge pump circuit after a DN signal from a phase frequency detector arrives at said charge pump circuit and before an UP signal from said phase frequency detector arrives at said charge pump circuit.

9. A charge pump circuit as claimed in claim 7 wherein said return path of said charge sharing suppression circuit permits a charge pump current to flow through said parasitic capacitance charge sharing suppression circuit during a period of time in which static phase error exists within said charge pump circuit after an UP signal from a phase frequency detector arrives at said charge pump circuit and before a DN signal from said phase frequency detector arrives at said charge pump circuit.

10. A charge pump circuit as claimed in claim 9 wherein said return path of said charge sharing suppression circuit comprises:
   a current source;
   a signal line having a first end coupled to an output of said current source;
   a first switch within said signal line that closes in response to the presence of said UP signal;
   a second switch within said signal line that closes in response to the presence of an inverted version of said DN signal; and
   a return path signal line having a first end coupled to a second end of said signal line and having a second end coupled to said parasitic capacitance charge sharing suppression circuit.

11. A charge pump circuit as claimed in claim 8 wherein said return path of said charge sharing suppression circuit comprises:
   a current source;
   a signal line having a first end coupled to an input of said current source;
   a first switch within said signal line that closes in response to the presence of an inverted version of said UP signal; and
   a second switch within said signal line that closes in response to the presence of said DN signal; and
   a return path signal line having a first end coupled to a second end of said signal line and having a second end coupled to said parasitic capacitance charge sharing suppression circuit.

12. A charge pump circuit as claimed in claim 7 wherein said return path of said charge sharing suppression circuit comprises:
   a first current source;
   a second current source;
   a first signal line having a first end coupled to an output of said first current source;
   a first switch within said first signal line that closes in response to the presence of an UP signal from a phase frequency detector;
   a second switch within said first signal line that closes in response to the presence of an inverted version of a DN signal from said phase frequency detector;
   a second signal line having a first end coupled to an input of said second current source and having a second end coupled to a second end of said first signal line;
   a third switch within said second signal line that closes in response to the presence of an inverted version of said UP signal;
   a fourth switch within said second signal line that closes in response to the presence of said DN signal; and
   a return path signal line having a first end coupled to said second end of said first signal line and to said second end of said second signal line, and having a second end coupled to said parasitic capacitance charge sharing suppression circuit.

13. A method for suppressing charge sharing due to static phase error in a charge pump circuit of a phase locked loop circuit, said method comprising the step of:
   causing a charge pump current to flow through a return path of a charge sharing suppression circuit within said charge pump circuit during a period of time in which said static phase error exists within said charge pump circuit.

14. A method as claimed in claim 13 further comprising the step of:
   causing said charge pump current to flow through said return path within said charge pump circuit during a period of time in which said static phase error exists within said charge pump circuit after a DN signal from a phase frequency detector arrives at said charge pump circuit and before an UP signal from said phase frequency detector arrives at said charge pump circuit.

15. A method as claimed in claim 13 further comprising the step of:
   causing said charge pump current to flow through said return path within said charge pump circuit during a period of time in which said static phase error exists within said charge pump circuit after an UP signal from a phase frequency detector arrives at said charge pump circuit and before a DN signal from said phase frequency detector arrives at said charge pump circuit.

16. A method as claimed in claim 15 further comprising the steps of:
   providing a current source;
   coupling a first end of a signal line to an output of said current source;
   coupling a return path signal line to a second end of said signal line;
   closing a first switch within said signal line in response to the presence of said UP signal; and
   closing a second switch within said signal line in response to the presence of an inverted version of said DN signal.

17. A method as claimed in claim 14 further comprising the steps of:
   providing a current source;
   coupling a first end of a signal line to an input of said current source;
   coupling a return path signal line to a second end of said signal line;
   closing a first switch within said signal line in response to the presence of an inverted version of said UP signal; and
   closing a second switch within said signal line in response to the presence of said DN signal.

18. A method as claimed in claim 13 further comprising the steps of:
   providing a first current source;
   providing a second current source;
   coupling a first end of a first signal line to an output of said first current source;
   coupling a first end of a second signal line to an input of said second current source and coupling a second end of said second signal line to a second end of said first signal line;

coupling a return path signal line to said second end of said first signal line and to said second end of said second signal line;

closing a first switch within said first signal line in response to the presence of an UP signal from a phase frequency detector;

closing a second switch within said first signal line in response to the presence of an inverted version of a DN signal from said phase frequency detector;

closing a third switch within said second signal line in response to the presence of an inverted version of said UP signal; and closing a fourth switch within said second signal line in response to the presence of said DN signal.

19. A method as claimed in claim 13 comprising the step of:

causing said charge pump current to flow through a return path of said charge sharing suppression circuit to a parasitic capacitance charge sharing suppression circuit that is capable of suppressing charge sharing due to parasitic capacitances within said charge pump circuit.

20. A method as claimed in claim 19 further comprising the step of:

causing said charge pump current to flow through said parasitic capacitance charge sharing suppression circuit during a period of time in which said static phase error exists within said charge pump circuit after a DN signal from a phase frequency detector arrives at said charge pump circuit and before an UP signal from said phase frequency detector arrives at said charge pump circuit.

21. A method as claimed in claim 19 further comprising the step of:

causing said charge pump current to flow through said parasitic capacitance charge sharing suppression circuit during a period of time in which said static phase error exists within said charge pump circuit after an UP signal from a phase frequency detector arrives at said charge pump circuit and before a DN signal from said phase frequency detector arrives at said charge pump circuit.

22. A method as claimed in claim 21 further comprising the steps of:

providing a current source;

coupling a first end of a signal line to an output of said current source;

coupling a first end of a return path signal line to a second end of said signal line;

coupling a second end of said return path signal line to a said parasitic capacitance charge sharing suppression circuit;

closing a first switch within said signal line in response to the presence of said UP signal; and closing a second switch within said signal line in response to the presence of an inverted version of said DN signal.

23. A method as claimed in claim 20 further comprising the steps of:

providing a current source;

coupling a first end of a signal line to an input of said current source;

coupling a first end of a return path signal line to a second end of said signal line;

coupling a second end of said return path signal line to a said parasitic capacitance charge sharing suppression circuit;

closing a first switch within said signal line in response to the presence of an inverted version of said UP signal; and closing a second switch within said signal line in response to the presence of said DN signal.

24. A method as claimed in claim 19 further comprising the steps of:

providing a first current source;

providing a second current source;

coupling a first end of a first signal line to an output of said first current source;

coupling a first end of a second signal line to an input of said second current source;

coupling a second end of said second signal line to a second end of said first signal line;

coupling a first end of a return path signal line to said second end of said first signal line and to said second end of said second signal line;

coupling a second end of said return path signal line to said parasitic capacitance charge sharing suppression circuit;

closing a first switch within said first signal line in response to the presence of an UP signal from a phase frequency detector;

closing a second switch within said first signal line in response to the presence of an inverted version of a DN signal from said phase frequency detector;

closing a third switch within said second signal line in response to the presence of an inverted version of said UP signal; and closing a fourth switch within said second signal line in response to the presence of said DN signal.

* * * * *

UNITED STATES PATENT AND TRADEMARK OFFICE
CERTIFICATE OF CORRECTION

PATENT NO. : 6,611,161 B1
DATED : August 26, 2003
INVENTOR(S) : Ravi Kumar and Chandra P. Tiwari It is certified that error appears in the above-identified patent and that said Letters Patent is hereby corrected as shown below:

Column 1,
Line 33, delete "FIN" and insert -- $F_{IN}$ --.

Column 6,
Line 10, delete "SS" after the term "Switch" and insert -- S5 -- and delete "SS" after the term "switch" and insert -- S5 --.

Signed and Sealed this

Twenty-second Day of November, 2005

JON W. DUDAS
*Director of the United States Patent and Trademark Office*